(12) United States Patent
Ziemins et al.

(10) Patent No.: US 6,467,120 B1
(45) Date of Patent: Oct. 22, 2002

(54) WAFER CLEANING BRUSH PROFILE MODIFICATION

(75) Inventors: Uldis Artis Ziemins, Poughkeepsie; Jose M. Ocasio, Maybrook; Raymond M. Khoury, Wappingers Falls; David Goodwin, Hyde Park, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/391,439

(22) Filed: Sep. 8, 1999

(51) Int. Cl.[7] .............................................. B08B 11/00
(52) U.S. Cl. ........................... 15/102; 15/97.1; 15/88.3
(58) Field of Search ........................... 15/21.1, 77, 102, 15/97.1, 88.2, 88.3, 88.4

(56) References Cited

U.S. PATENT DOCUMENTS

| | | | |
|---|---|---|---|
| 5,311,634 A | * | 5/1994 | Andros |
| 5,441,598 A | | 8/1995 | Yu et al. |
| 5,558,563 A | | 9/1996 | Cote et al. |
| 5,609,517 A | | 3/1997 | Lofaro |
| 5,645,469 A | | 7/1997 | Burke et al. |
| 5,766,058 A | | 6/1998 | Lee et al. |
| 5,785,584 A | | 7/1998 | Marmillion et al. |
| 5,870,792 A | * | 2/1999 | Shurtliff |
| 5,870,793 A | | 2/1999 | Choffat et al. |
| 6,070,284 A | * | 6/2000 | Garcia |
| 6,247,197 B1 | * | 6/2001 | Vail |
| 6,299,698 B1 | * | 10/2001 | Emami |

OTHER PUBLICATIONS

One sheet of Rippey PVA Products from www.rippey.com Web site, Aug., 1999.

* cited by examiner

*Primary Examiner*—Randall E. Chin
(74) *Attorney, Agent, or Firm*—Jay H. Anderson

(57) ABSTRACT

A wafer cleaning brush roller having uniform and non-uniform protrusions via compression. The protrusions are formed by an inner PVA sponge compressed through an outer sleeve formed of a resilient mesh that does not react with DI water or other CMP surfactants. Directional channeling of DI water is also provided to the protrusions. Edge cleaning of the wafer as accomplished by having a thicker brush extension at each end where the wafer's edge would rub and provide added cleaning capability.

12 Claims, 7 Drawing Sheets

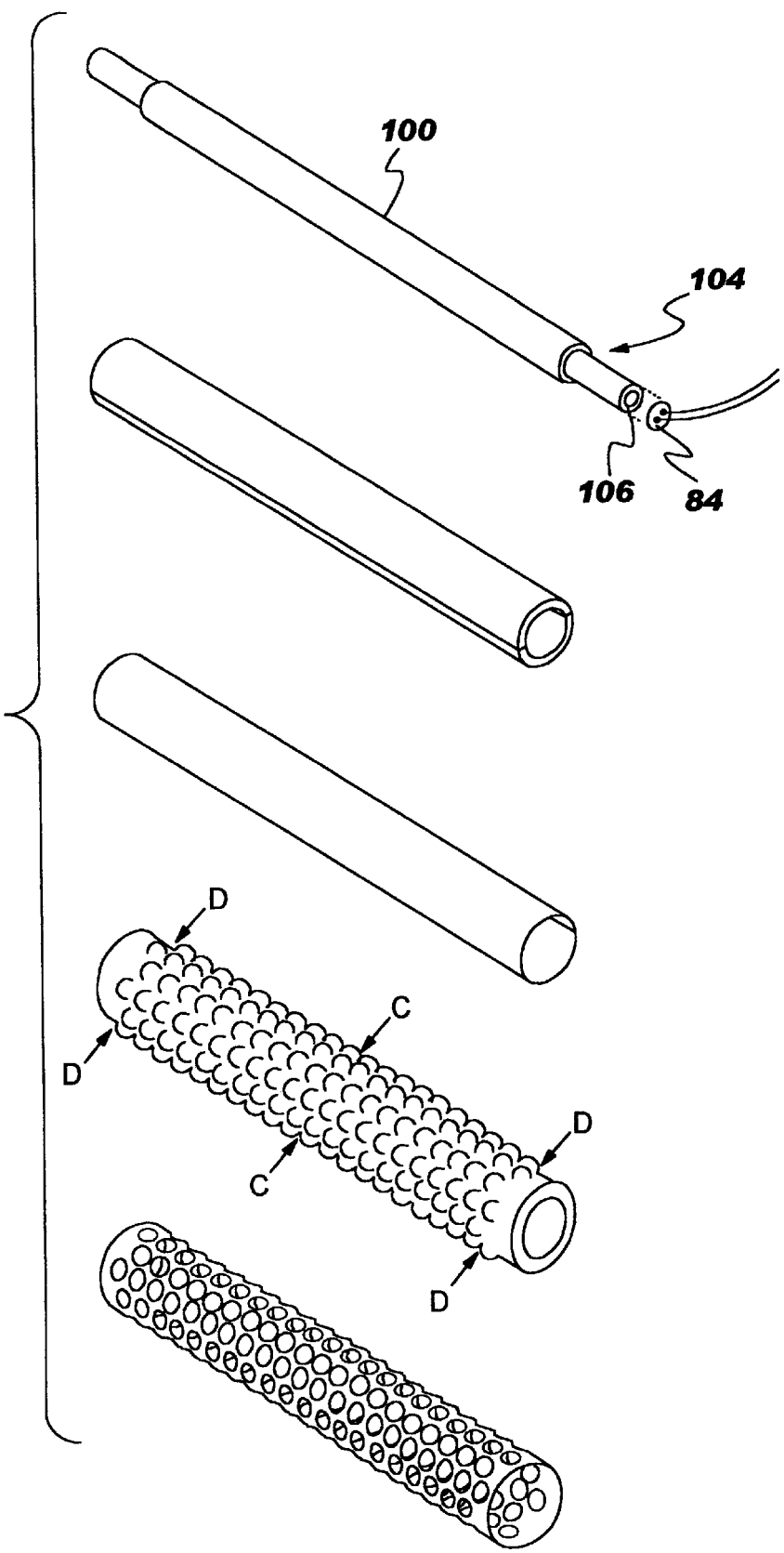

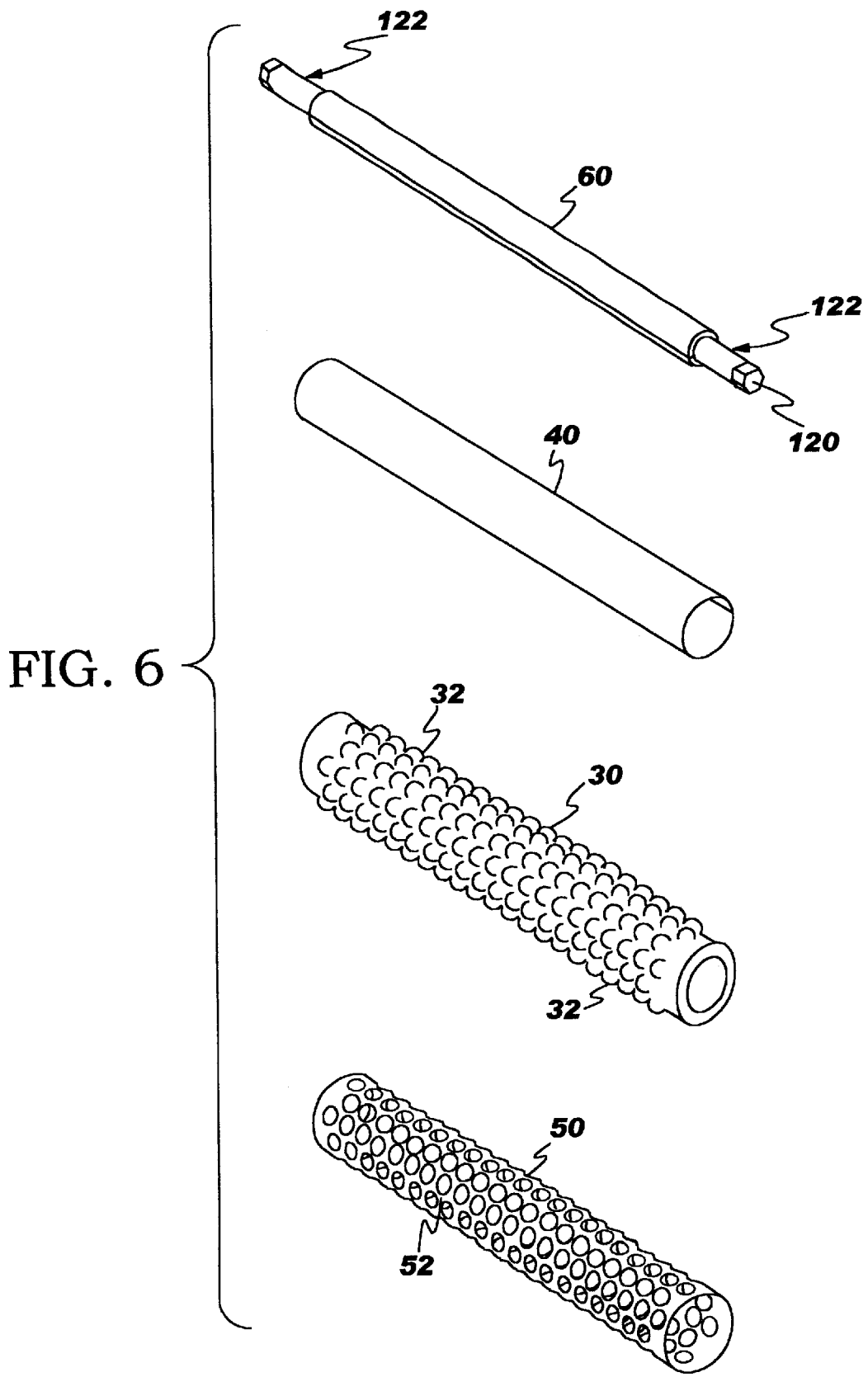

WAFER CLEANING BRUSH PROFILE MODIFICATION

FIELD OF THE INVENTION

This invention is directed generally to chemical mechanical polishing operations performed during integrated circuit manufacturing, and more particularly to polishing brushes used for mechanical or chemical-mechanical planarization of a semiconductor substrate.

BACKGROUND OF THE INVENTION

Chemical mechanical polishing ("CMP") is a method used in semiconductor processing to planarize step-like features on a semiconductor wafer. Using the CMP process, a wafer is pressed (upside down) against a rotating polishing pad in the presence of a chemical corrosive slurry. The action of the slurry and the rotary motion of the polishing pad combine to remove a desired amount of material from the wafer and achieve a planar surface. Polishing is automatically stopped at a desired level or location so that no more than the desired amount of material is removed.

The main purpose for a typical CMP process is to achieve a high degree of flatness or planarity across the wafer surface. Local planarity (for closely spaced features) and global planarity (for uniformity across the wafer surface) are both important. Both forms of planarity are difficult to achieve because when semiconductor wafers are made they often do not result in uniformly flat surfaces. Also, during the processing steps of manufacturing the integrated circuit many different features of various sizes and densities are created and deposited across the wafer surface. Both inherent non-uniformities in the wafer surface and non-uniformities that result from the plurality of diffusion and etching steps are created, which can be removed through CMP.

Typically, the polishing pad includes brushes that perform the mechanical aspect of the CMP process. Brushes can be in the form of a pad or in the form of a roller. The roller can also be used to clean the wafer, and commonly includes a plurality of brushes around the outer cylindrical surface of the roller. Currently available CMP roller brushes have rectangular protrusions set at a fixed pitch across the entire body of the roller. An example of one such roller brush used throughout the industry is shown in FIG. 1. The brush 10 is made of polyvinyl alcohol ("PVA") across its entire body 12 and inserted over a core roller 14 that attaches to a drive mechanism (not shown). The drive mechanism is used to rotate the brush 10 and promote cleaning of wafers for the semiconductor industry. Two common systems that use this style brush configuration are made by Ebara Technologies and OnTrak Systems, Inc.

One problem encountered with the above-described brushes is the inclusion of a square or rectangular protrusion 16, which collects or proliferates contamination (e.g., slurry build-up) around the outer edge 18 of the protrusion 16. This contamination is due to the shape of the protrusion 16, which can also cause scratches to the underlying copper (Cu) metalization and thereby reduce yield. A need therefore exists for an improved shape to the protrusion 16 that eliminates or substantially reduces the scratching of the wafer surface.

SUMMARY OF THE INVENTION

In view of the above, there is provided a wafer cleaning brush profile modification. According to one aspect of the invention, a brush for cleaning a wafer includes a cylindrical sleeve with openings formed therein. The brush also includes a compressible member inserted into the sleeve, and an expandable core member inserted into the sleeve along an axis thereof. Expansion of the core member causes portions of the compressible member to protrude radially through the openings of the sleeve such that these portions have a substantially uniform profile with respect to the sleeve. In one presently preferred embodiment of the invention, the uniform profile is rounded, diamond-shaped, mushroom shaped, or can take on any conceivable shape.

The invention thus builds on the roller brush concept to improve uniformity, deionized ("DI") water channeling, less foreign matter ("FM") due to less brush material exposed, selective contouring of protrusions and brush density variation ability. It is an object of the invention therefore to help eliminate brush induced scratching and FM to improve chip yield across the wafer. It is another object of the invention to promote DI water channeling directly to the point of contact of brush protrusion to wafer surface, henceforth decreasing brush absorption of contaminants and prolonging brush life.

These and other features and advantages of the invention will become apparent to those skilled in the art upon a review of the following detailed description of the presently preferred embodiments of the invention, viewed in conjunction with the appended drawings.

BRIEF DESCRIPTION OF THE DRAWINGS

FIG. 5 is a perspective exploded view of an alternate embodiment of the invention using an air bladder.

FIG. 6 is a perspective exploded view of an alternate embodiment of the invention using NPT screws.

DESCRIPTION OF THE PRESENTLY PREFERRED EMBODIMENTS OF THE INVENTION

Figure 1:
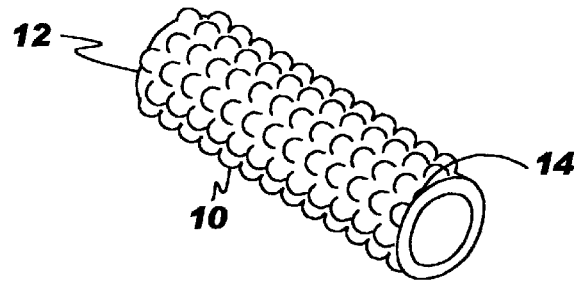
FIG. 1 illustrates examples of prior art chemical mechanical polishing brushes and pads.
Figure 2:
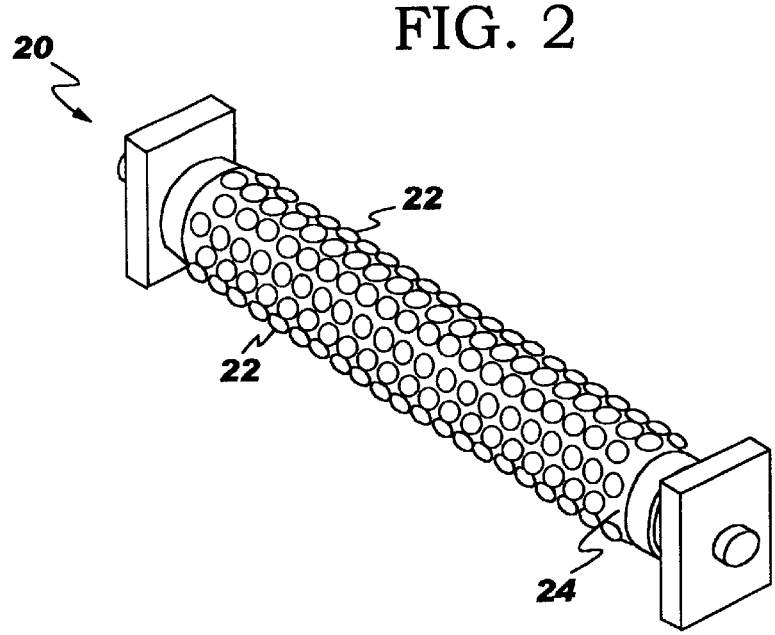
FIG. 2 is a fully assembled perspective view of one presently preferred embodiment of the invention.

Reference is now made to the drawings where like elements receive like reference numerals throughout. Referring to FIG. 2, a fully assembled CMP brush roller 20 is shown. The brush roller 20 includes protrusions 22, which protrude radially outwardly from an outer cylindrical sleeve 24. The protrusions 22 are preferably rounded or spherical in profile as shown in FIG. 2. Alternatively, the protrusions 22 can be formed in a mushroom-like shape where the stem portion attaches to the sleeve 24 and the head takes on a substantially uniform or continuous profile.

Figure 3:
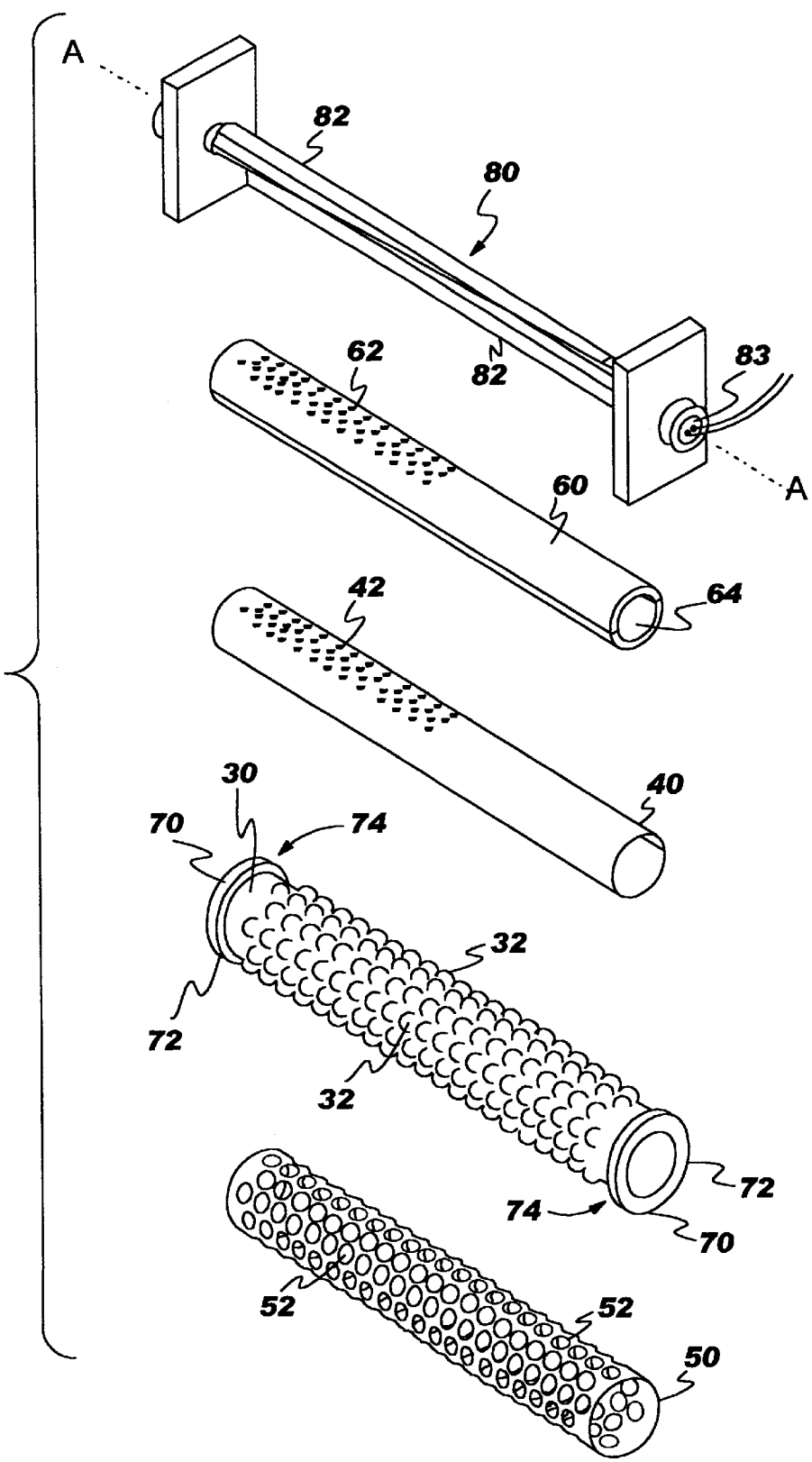
FIG. 3 is a perspective exploded view of the embodiment shown in FIG. 2.

FIG. 3 shows an exploded view of the CMP brush roller 20 shown in FIG. 2. A sponge member 30, preferably made from PVA sponge (Rippey Corp.) to a thickness of 4.0 mm (shown in FIG.3 in compressed position) is wrapped around an intermediate sleeve 40. The intermediate sleeve 40 includes holes 42, preferably having diameters of 0.125 inches. These holes 42 correspond to larger holes 52, preferably having diameters of 0.375 inches spaced at 0.475 inch centers, in an outer sleeve 50. As described in more detail below, the holes 52 in the outer sleeve 50 channel or direct DI water and other materials to the protrusions 32 disposed on the sponge member 30. The sponge member 30 is also uniformly compressed through the outer sleeve 50, which preferably is formed by a webbing, such as for example Duronet (Air Plastics Corp.), producing a very repetitive contoured profile at each hole 52 in the outer sleeve 50.

The intermediate sleeve 40 is preferably made of a resilient polymer and has a 0.030 inch wall thickness. The intermediate sleeve 40 includes a hole pattern 42 that matches the hole pattern 52 of the outer sleeve 50. The outer sleeve 50 is inserted over the intermediate sleeve 40 and the sponge member 30 during assembly. The outer sleeve 50 preferably has an outer diameter of 61.6 mm and is made from the same polymer material as the intermediate sleeve 40.

An expansion sleeve 60 is also provided that has the same hole pattern 62 as the intermediate sleeve 40 (preferably 0.125 inch diameter holes at 0.475 inch spacing). This again allows for directional channeling of DI water to each specific protrusion 32.

During wafer processing the wafer (not shown) spins and oscillates. To take advantage of this motion, an overhang in the sponge member 30 is produced to compensate for and enhance wafer edge cleaning. A thicker section 70, preferably extending 4.0 mm above the sponge member 30, forms an added ring or rim 72 at both ends 74 of the sponge member 30. This thicker section 70 protrudes at each end 74 of the brush roller 20 to provide a wafer edge cleaning capability in addition to polishing the wafer surface. As described in more detail below, added water jets or internal hole patterns 42, 62 of the intermediate and expansion sleeves 40, 60 could be modified to direct more water to the outer rim 72 of each sponge member 30. External water jets could also be included to expedite edge cleaning.

During assembly, the expansion sleeve 60 is inserted, in its unexpanded state, through the intermediate sleeve 40. The intermediate sleeve 40 is then inserted over inner assembly 80, which preferably includes a dual compound wedge 82 inserted through its core 83. The dual compound wedge 82 is used to start the expansion process of the sponge member 30. The sponge member 30 is uniformly compressed through the outer sleeve 50 producing a very repetitive contoured profile at each opening 52 in the outer sleeve 50. Compression of the sponge member 30 may vary from 20% to 80% of original thickness, using 4–10 mm sponge samples. In the preferred embodiment, a 4 mm sponge member 30 is used due to the preferred dual compound wedge 82 compression means used. The compound wedge assembly 82 can be constructed of Kynar or polyvinylene fluoride, or any other suitable structural material, that does not react with DI water or other CMP surfactants or slurries. Its purpose is to expand uniformly around its central axis A—A to compress the sponge member 30 through the holes 52 in the outer sleeve 50, or any equivalent webbing, to produce uniform protrusions 32 as shown.

The dual compound wedge 82 preferably has compound angles to provide expansion in both X-Y axes, which produces uniform pressure on the inner wall 64 of expansion sleeve 60. This compresses the sponge member 30 and forms a uniform brush surface of protrusions 32. The dual compound wedge 82 can be expanded to compress the sponge member 30 via screws (described below) or other mechanical means generally known in the art to provide pressure uniformly to the expansion sleeve 60.

In the embodiment shown in FIG. 3, Di water or surfactant can be injected through a rotary union 84. Preferably, DI water or surfactant is channeled to each individual protrusion 32 by cooperation of the expansion sleeve 60, the intermediate sleeve 40 and the outer sleeve 50 and their corresponding holes 62, 42, 52 (channel ports) to provide unidirectional flow to each protrusion 32.

Figure 4:
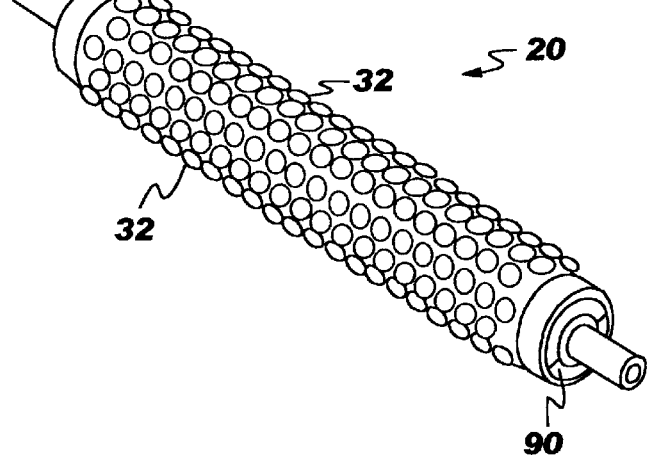
FIG. 4 is perspective view of a fully assembled alternate embodiment of the invention using a water bladder.

Alternate embodiments to the inner assembly 80 for compressing the sponge member 30 are shown in FIGS. 4–11. For example, FIG. 4 shows another technique to compress the sponge member 30 by using a water bladder 90. The water bladder 90 is disposed within the inner assembly 80, and can be used to expand the expansion sleeve 60 and thus provide uniform pressure to the sponge member 30. The bladder 90 may also have small holes (not shown) that weep water to the channels of inner holes 42, 62 (FIG. 3) and provide internal DI/surfactant to the protrusions 32.

In FIG. 5 an air bladder 100 is shown, which is similar to the water bladder 90 in FIG. 4, and can be used as the means for compression of the sponge member 30. The water bladder 90 or air bladder 100 is preferably a sealed or self-contained unit. It also preferably has air or water pressure supplied to it via a rotary union connection 84 at one side 104 of the inner assembly 80. The air/water supply may be varied in pressure to obtain various compression densities of the sponge member 30 in a manner generally known in the art. The expanded shape of the sponge member 30 may also be varied to compensate for wafer deflection or provide more uniform contact surface to the substrate being cleaned. The sponge member 30 may also have a larger center diameter C—C that contours to the edges 106 with a smaller diameter D—D.

Figure 7:
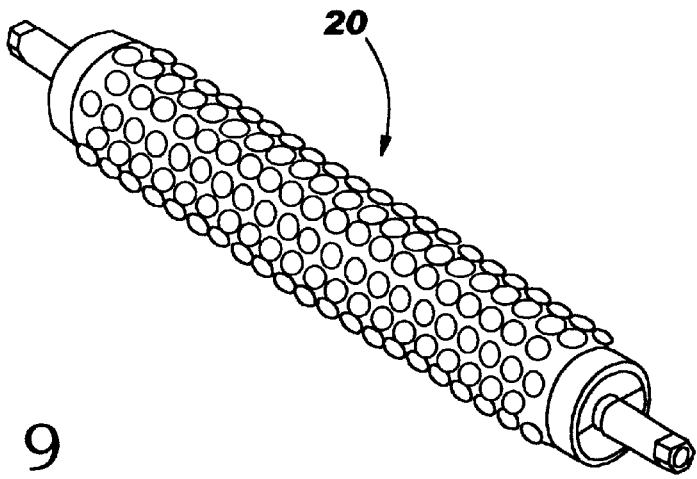
FIG. 7 is a fully assembled view of the embodiment shown in FIG. 6.

Another technique for compressing the sponge member 30 is shown in FIG. 6. According to this alternate embodiment, National Pipe Thread ("NPT") screws 120 are placed at each end 122 of the inner assembly 80 adjacent the expansion sleeve 60. According to this embodiment, the sleeve 60 is expanded by tightening the screws 120 to provide compression of the sponge 30 through the outer sleeve 50. A completely assembled brush 20 with NPT screws 120, causing expansion and providing uniform protrusions 32, is shown in FIG. 7.

Figure 9:
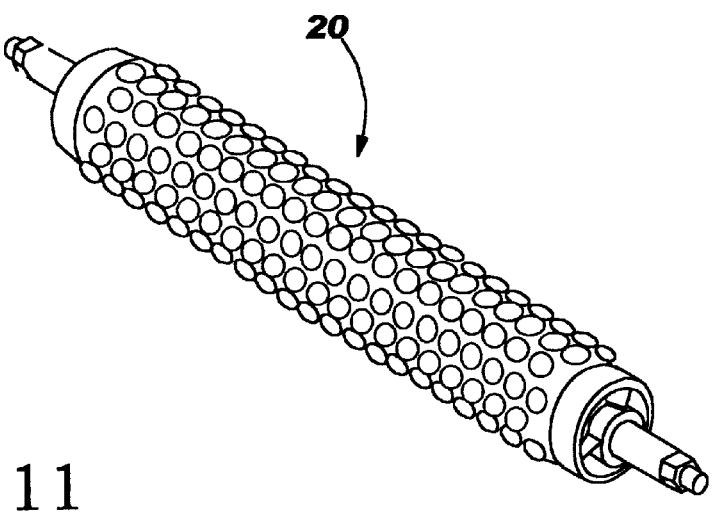
FIG. 9 is a fully assembled view of the embodiment shown in FIG. 8.
Figure 11:
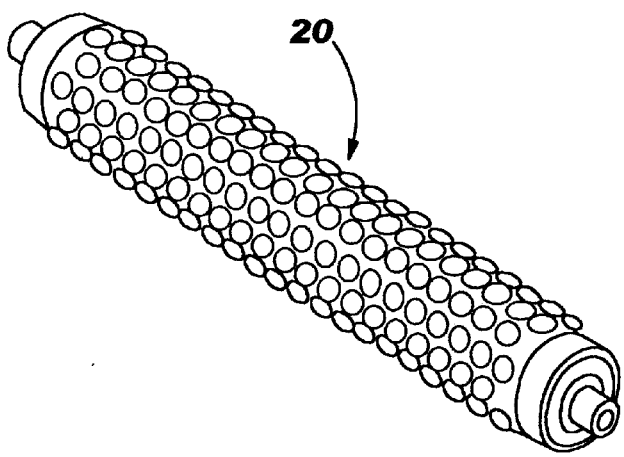
FIG. 11 is a fully assembled view of the embodiment shown in FIG. 10.
Figure 8:
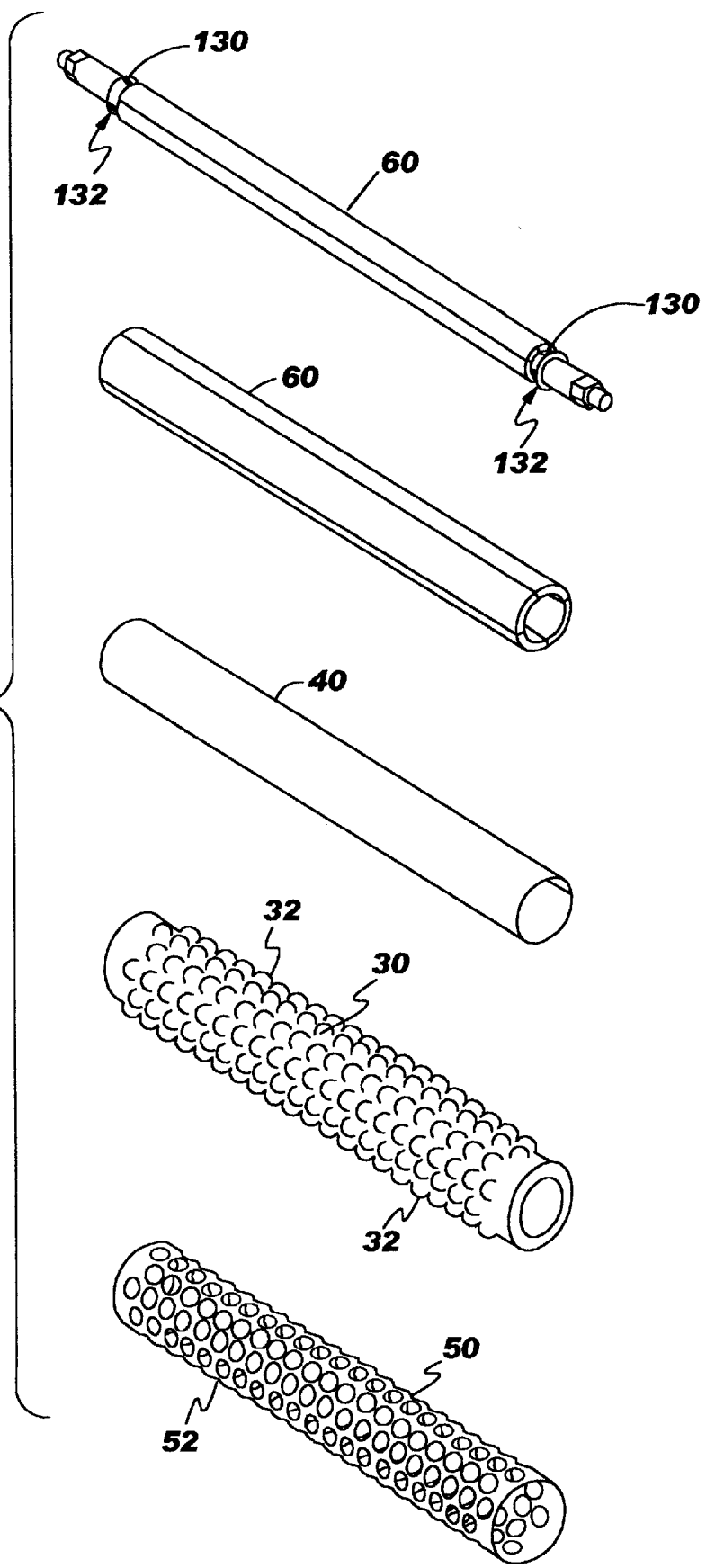
FIG. 8 is a perspective exploded view of an alternate embodiment of the invention using cone wedges.
Figure 10:
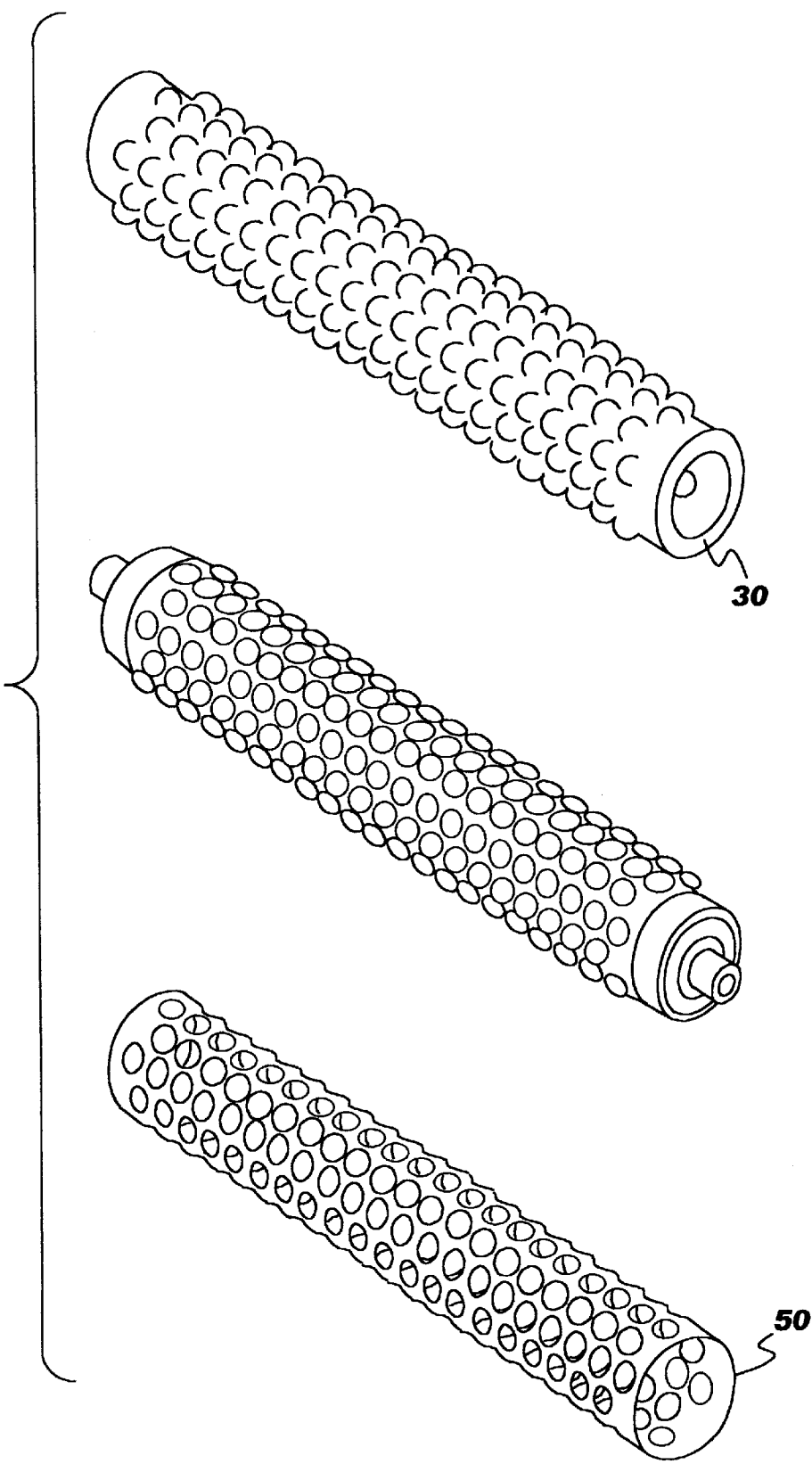
FIG. 10 is a perspective exploded view of an alternate embodiment of the invention using a core with bumps.

Other alternatives to the inner assembly 80 shown in FIG. 3 include utilizing cone wedges 130 at each end 132 of the expansion sleeve 60, as shown in FIG. 8 (exploded view) and FIG. 9 (fully assembled view); and utilizing a core with inner bumps (not shown) that compress the sponge member 30 at each web opening 52 in the outer sleeve 50 is shown in FIG. 10 (exploded view) and FIG. 11 (fully assembled view). In each case, sleeve expansion may or may not include internal water jackets to direct DI flow to the protrusions. Alternatively, DI water/surfactant may be supplied via an external source to the brush protrusions 32 alone. In another embodiment, both internal and external DI/surfactant can be supplied in combination to provide optimum debris removal. As those skilled in the art will appreciate, therefore, many techniques are viable in the expansion of the expansion sleeves 60 to provide uniform or non-uniform protrusions 32. Non-uniform protrusions 32 may be used to compensate for deflection of the wafer where the center of the brush 20 may be slightly larger in diameter than the ends, providing more contact cleaning surface.

As can be seen, the novel wafer cleaning brush profile modification provides numerous advantages over prior brush designs. For example, the wafer cleaning brush profile modification provides the ability to contour and shape brush contact points to enhance and eliminate FM. The wafer cleaning brush profile modification also provides less brush surface area to provide better liquid channeling/flow to decrease FM, and less brush area to accumulate particles. The rounded shape of the wafer cleaning brush profile modification also helps eliminate scratching of wafers and erosion of copper metalization.

Further advantages include providing more precise contact uniformity across the entire wafer to improve cleaning, more accurate control for calibrating brush position to wafer for ease of set-up and repeatability, and the ability to shape overall brush contour to compensate for wafer deflection such as a concave/convex profile. These advantages reduce the cost of manufacture, eliminate the chance of brush contact protrusions tearing and being deposited on the substrate, and the loss of brush surface area. Finally, the use of various compression techniques using air/DI water enables the control of various brush densities and applied force to the wafer.

It will be appreciated that a wide range of changes and modifications to the wafer cleaning brush profile modification are contemplated. For example, persons skilled in the art may employ many other such techniques for sleeve expansion and brush compression. Accordingly, while preferred embodiments have been shown and described in detail by way of examples, further modifications and embodiments are possible without departing from the scope of the invention as defined by the examples set forth. It is therefore intended that the invention be defined by the appended claims and all legal equivalents.

We claim:

1. A brush for cleaning a wafer, comprising:

a cylindrical sleeve with openings formed therein;

a compressible member inserted into the sleeve, the compressible member having portions which protrude radially through the openings of the sleeve, said portions having a substantially uniform profile with respect to the sleeve; and an expandable core member inserted into the sleeve along an axis thereof, wherein the expansion of the core member causes the portions of the compressible member to protrude through the openings of the sleeve.

2. The brush defined in claim 1, wherein the uniform profile comprises a round profile.

3. The brush defined in claim 1, wherein the uniform profile comprises a mushroom shaped profile.

4. A brush for polishing a wafer, comprising:

a cylindrical roller base having an outer circumferential surface disposed substantially parallel to the wafer;

a plurality of flexible protrusions disposed about the outer circumferential surface of the roller base adjacent the wafer, wherein the plurality of protrusions have a substantially continuous profile;

a compressible member inserted into the cylindrical roller base; and an inner assembly including dual compound wedges to expand the compressible member.

5. The brush defined in claim 4, wherein the substantially continuous profile comprises a round profile.

6. The brush defined in claim 4, wherein the substantially continuous profile comprises a mushroom shaped profile.

7. The brush defined in claim 4, further comprising an inner assembly including a water bladder to expand the compressible member.

8. The brush defined in claim 4, further comprising an inner assembly including an air bladder to expand the compressible member.

9. The brush defined in claim 4, further comprising an inner assembly including screws to expand the compressible member.

10. The brush defined in claim 4, further comprising an inner assembly including cone wedges to expand the compressible member.

11. The brush defined in claim 4, further comprising an inner assembly including an inner core having bumps that align with the plurality of flexible protrusions.

12. The brush defined in claim 4, further comprising an edge cleaning section, the edge cleaning section extending radially outwardly and disposed at each end of the cylindrical roller base.

* * * * *